US006978011B1

(12) United States Patent  (10) Patent No.: US 6,978,011 B1
Bailey  (45) Date of Patent: Dec. 20, 2005

(54) ENHANCED LOW PASS FILTER

(75) Inventor: Richard H. Bailey, Raleigh, NC (US)

(73) Assignee: Alcatel, Paris (FR)

( * ) Notice: Subject to any disclaimer, the term of this patent is extended or adjusted under 35 U.S.C. 154(b) by 733 days.

(21) Appl. No.: 09/817,777

(22) Filed: Mar. 26, 2001

Related U.S. Application Data

(60) Provisional application No. 60/273,106, filed on Mar. 2, 2001.

(51) Int. Cl.$^7$ ............................................. H04M 1/00
(52) U.S. Cl. ........................ 379/390.02; 379/390.04; 379/393; 379/413.03
(58) Field of Search ........................ 379/390.02, 391, 379/399.01, 402, 413.02

(56) References Cited

U.S. PATENT DOCUMENTS

| | | | | | |
|---|---|---|---|---|---|
| 5,627,501 | A | * | 5/1997 | Biran et al. | ............. 333/17.1 |
| 6,137,880 | A | * | 10/2000 | Bella | .................. 379/399.01 |
| 6,181,777 | B1 | * | 1/2001 | Kiko | .................. 379/32.04 |
| 6,385,315 | B1 | * | 5/2002 | Viadella et al. | ......... 379/88.23 |
| 6,418,221 | B1 | * | 7/2002 | Snow et al. | .......... 379/399.01 |
| 6,473,507 | B1 | * | 10/2002 | Eckert | .................. 379/416 |
| 6,690,721 | B1 | * | 2/2004 | Murphy et al. | ............ 375/222 |
| 6,694,016 | B1 | * | 2/2004 | Sun et al. | ............. 379/399.01 |
| 2002/0041676 | A1 | * | 4/2002 | DeCramer et al. | .... 379/399.01 |

FOREIGN PATENT DOCUMENTS

JP 354129453 A * 10/1979 ............... 361/117

* cited by examiner

Primary Examiner—Curtis Kuntz
Assistant Examiner—Pham Tuan
(74) Attorney, Agent, or Firm—Simon, Galasso & Frantz; Craig A. Hoersten; Bobby D. Slaton (57) ABSTRACT

An ADSL POTS splitter includes an enhanced low pass filter. The enhanced low pass filter includes a first filter capacitor, a first non-isolated inductor, a second non-isolated inductor, a first isolated inductor and a common mode choke. The second non-isolated inductor is connected to the first non-isolated inductor. A first winding of the second non-isolated inductor is connected in series with a first winding of the first non-isolated inductor. A second winding of the second non-isolated inductor connected in series with a second winding of the first non-isolated inductor. The first isolated inductor is connected to the first non-isolated inductor with a first winding of the first isolated inductor connected in series with the first winding of the first non-isolated inductor and to a first lead of the first filter capacitor. A second winding of the first isolated inductor connected in series with the second winding of the first non-isolated inductor and to a second lead of the first filter capacitor. The first non-isolated inductor has a respective DC saturation current and the isolated inductor has a respective DC saturation current. The DC saturation current of the first non-isolated inductor is substantially greater than the DC saturation current of the isolated inductor for achieving higher inductance in the isolated inductor. The common mode choke is connected between the first non-isolated inductor and the first filter capacitor. A first winding of the common mode choke connected in series with the first winding of the first non-isolated inductor and with the first winding of the first isolated inductor. A second winding of the common mode choke is connected in series with the second winding of the first non-isolated inductor and with the second winding of the first isolated inductor.

27 Claims, 2 Drawing Sheets

FIG. 4

ENHANCED LOW PASS FILTER

CROSS REFERENCE TO RELATED APPLICATIONS

This application claims the benefit of U.S. Provisional Patent Application No. 60/273,106 filed on Mar. 2, 2001 entitled "ENHANCED LOW PASS FILTER," of common assignee herewith.

FIELD OF THE DISCLOSURE

The disclosures herein relate generally to low pass filters and more particularly to low pass filters capable of achieving improved ADSL bit error rate performance in the presence of POTS signaling transients.

BACKGROUND

Asymmetric Digital Subscriber Line (ADSL) is a communication technology that enables existing twisted-pair telephone lines to serve as access paths for applications such as multi-media and high-speed data communications. An ADSL circuit includes an ADSL modem connected at each end of a twisted-pair telephone line. In one configuration, an ADSL service provides three information channels: a high-speed downstream data channel, a medium speed upstream data channel and a Plain Old Telephone Service (POTS) channel. The combination of simultaneous downstream and upstream data channels yields duplex data transmission as well as simultaneous POTS service.

In ADSL applications, often associated with the POTS channel are POTS signaling transients that primarily result from telephone ringing voltage cutting on and off, such as the changing back and forth between the active ringing interval and the silent ringing interval. A typical ringing cycle consists of a 2 second active ringing interval followed by a 4 second silent ringing interval, and then the overall ringing cycle repeats over and over again until the called party answers. Use of unbalanced ringing, which is prevalent in the USA, makes the effects of these signaling transients more severe than is the case for balanced ringing. The unbalanced ringing voltage, including its cut-on and cut-off transients, has a common mode voltage component and a differential voltage component. The ringing voltage changes rapidly when it cuts on and off and this is one type of POTS signaling transient. In the case of unbalanced ringing voltage, these signaling transients have both a common mode and differential transient voltage component.

ADSL modems are generally associated with a separate POTS low pass filter for filtering the differential transient voltage as well as for filtering the ADSL signal from getting through to the voice terminals. However, some conventional POTS low pass filters, such as those offered by Coming Cabling System, provide little or no filtering of the common mode component of the transient voltage. Furthermore, some of the unfiltered common mode transient voltage passes through the line isolation transformer of an ADSL transceiver unit (ATU).

A value of an encoded bit of information can be altered unintentionally in the presence of common mode transient voltage, causing the bit to be interpreted incorrectly by the ADSL transceiver unit. Such an unintentionally altered bit is commonly referred to as a bit error. The percentage of received bits in error compared to a total number of bits received over a period of time is commonly referred to as the bit error rate. In such a period of time, reducing the bit error rate increases the time available for transmitting 'good' bits of information and minimizes the detrimental effects of the 'bad' bits of information. One of the main purposes of the POTS low pass filter is reduce the bit error rate that results from POTS signaling transients.

Another type of POTS signaling transient is the ring trip transient that occurs when the called party answers a call coming to him by taking his phone off hook. A phone has low impedance at DC and low frequencies when off hook and has a high impedance when it is on hook. Thus, a ring trip transient causes the current through the phone and the POTS low pass filter to increase significantly and abruptly.

The bit error rate associated with the ring trip transient is worse if the call is answered during a ringing interval rather than a silent interval of the ringing cycle. This is because a central office POTS switch applies only a DC voltage to the line during the silent interval. A higher amplitude AC ringing voltage is superimposed on the DC voltage and applied to the line during the ringing interval, and this causes the ring trip currents to be higher during the ringing interval than they are during the silent interval. Bit errors associated with an ADSL transceiver unit of the ADSL modem can be caused by the high ring trip currents in POTS low pass filter designs where the magnetic coils (or inductors) are not capable of handling the worst case ring trip current without experiencing DC current saturating. DC saturation current is an important factor in determining the size of the coils in a POTS low pass filter design.

There is a delay from when the called party answers until the central office POTS switch detects the phone going off-hook. The phone going off-hook causes the switch to cut off the AC ringing voltage being applied to the line and this completes the overall ring trip event. The cutting off of the ringing voltage at this time is a POTS signaling transient in itself and is similar to the POTS signaling transients discussed earlier that pertained to the ringing event prior to the ring trip.

In addition to limitations associated with ADSL bit error rate performance, the utility of conventional POTS low pass filters can also be limited by their physical size. Some conventional POTS low pass filters are too large for use on many high-density Digital Subscriber Line Access Multiplexor DCSLAM) units. In many instances, conventional POTS low pass filters include one or more magnetic coils whose physical size takes up too much volume for use with high-density DSLAM units Therefore, a low pass filter including a circuit design that contributes to providing increased ADSL bit error rate performance in the presence of POTS signaling transients and that provides for a relatively small low pass filter package size is useful.

DETAILED DESCRIPTION OF THE FIGURES

Figure 1:
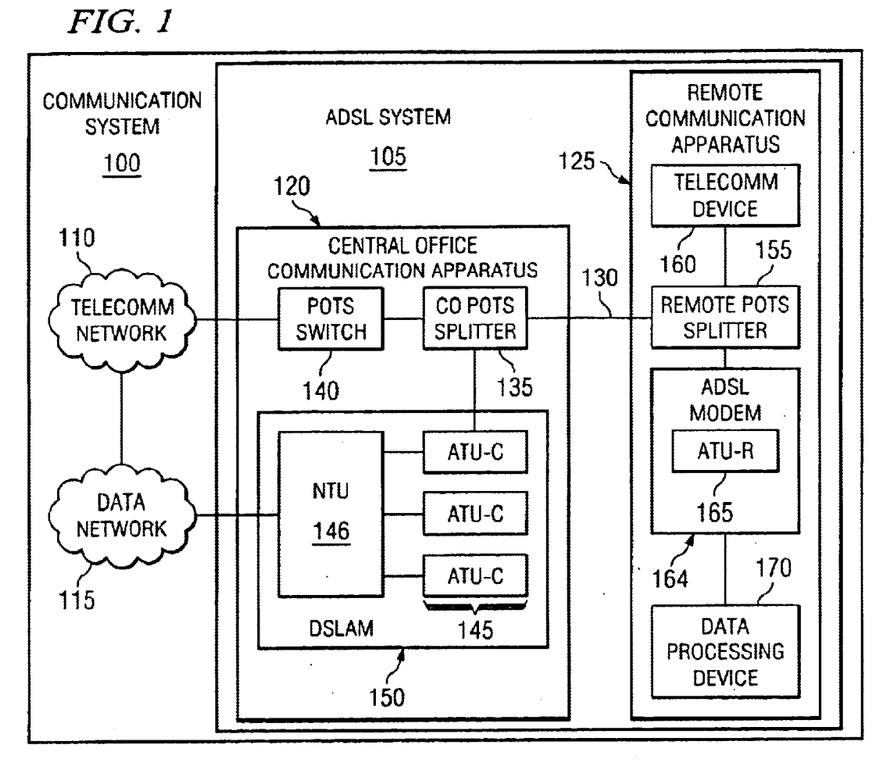
FIG. 1 is a block diagram view depicting an embodiment of a communication system.

An embodiment of a communication network 100 is depicted in FIG. 1. The communication network 100 includes an Asymmetric Digital Subscriber Line (ADSL) system 105 including a telecommunication network 110 and a data network 115 connected thereto. The telecommunication network 110 is connected directly to the data network 115 for enabling direct communication therebetween. A Public Switched Telephone Network (PSTN) is an example of the telephone network system 110. A computer network system, such as the Internet, is an example of the data network system 115. In other embodiments (not shown) of the communication system 100, the telecommunication network 110 is not connected directly to the data network 115.

The ADSL system 105 includes a central office communication apparatus 120 and a remote communication apparatus 125 connected to the central office apparatus 120 for providing an ADSL service therebetween. The central office communication apparatus 120 facilitates Plain Old Telephone Service (POTS) and ADSL service for the remote communication apparatus 125 via the telephone network system 110 and the data network system 115, respectively. The central office communication apparatus 120 is connected to the remote communication apparatus 125 via a paired-conductor transmission line 130. A twisted pair telephone line that is used for carrying telephony signals is an example of the paired-conductor transmission line 130. An ADSL signal and a POTS (voice) signal are transmitted together (multiplexed) over the paired-conductor transmission line 130.

The central office communication apparatus 120 includes a Central Office (CO) POTS splitter 135, a CO POTS switch 140, an ADSL Transceiver Unit (ATU-C) 145 of a Digital Subscriber Line Access Multiplexor (DSLAM) 150 and a Network Termination Unit 146 of the DSLAM 150. The POTS switch 140 and the CO ATU-C 145 connected to the CO POTS splitter 135. The DSLAM 150 is connected to the ATU-C 145 via the NTU 146. The central office communication apparatus 120 may include one or more additional ADSL transceiver units connected to the DSLAM 150.

In an upstream direction (toward the data network system 115), the DSLAM 150 combines, or multiplexes, ADSL data traffic from different subscribers onto a high-speed access line such as an Asynchronous Transfer Mode (ATM) link (not shown) of the CO communication apparatus 120. The high-speed access line is connected to the data network system 115. In a downstream direction (toward the remote location communication apparatus), the DSLAM 150 divides high-speed data traffic from the data network system 115 into several ADSL data channels. Each channel is connected to a respective CO ATU-C, such as the CO ATU-C 145.

The remote location communication apparatus 125 includes a remote POTS splitter 155, a telecommunication device 160, an ADSL modem 164 including a remote ADSL Transceiver Unit (ATU-R) 165, and a data processing device 170. The telecommunication device 160 and the ADSL modem 164 are both connected to the remote POTS splitter 155. The data processing device 170 is connected to the ADSL modem 164. A telephone and a personal computer are examples of the telecommunication device 160 and the data processing device 170, respectively.

The CO POTS splitter 135 is connected to the remote POTS splitter 155 via the paired-conductor transmission line 130. The CO POTS splitter 135 and the remote POTS splitters 155 allow ADSL signals to coexist on the paired-conductor transmission line 130 with telephony signals. In this manner, simultaneous access to ADSL service and POTS service is provided.

The CO POTS splitter 135 and the remote POTS splitters 155 are bi-directional devices. In a traffic direction away from the paired-conductor transmission line 130, each one of the POTS splitters 135, 155 splits a corresponding inbound aggregate signal into a POTS signal and an ADSL signal. In a traffic direction toward the paired-conductor transmission line 130, each one of the POTS splitters 135, 155 combines an outbound POTS signal and an outbound ADSL signal into a corresponding outbound aggregate signal.

The POTS signal corresponds to a POTS channel and the ADSL signal corresponds to one or more ADSL channels. In one embodiment of the ADSL service, a high-speed downstream data channel and a medium-speed duplex (upstream and downstream) data channel carry respective portions of the ADSL signal. In another embodiment of the ADSL service, a high-speed downstream data channel and a medium-speed upstream data channel carry respective portions of the ADSL signal.

Figure 2:
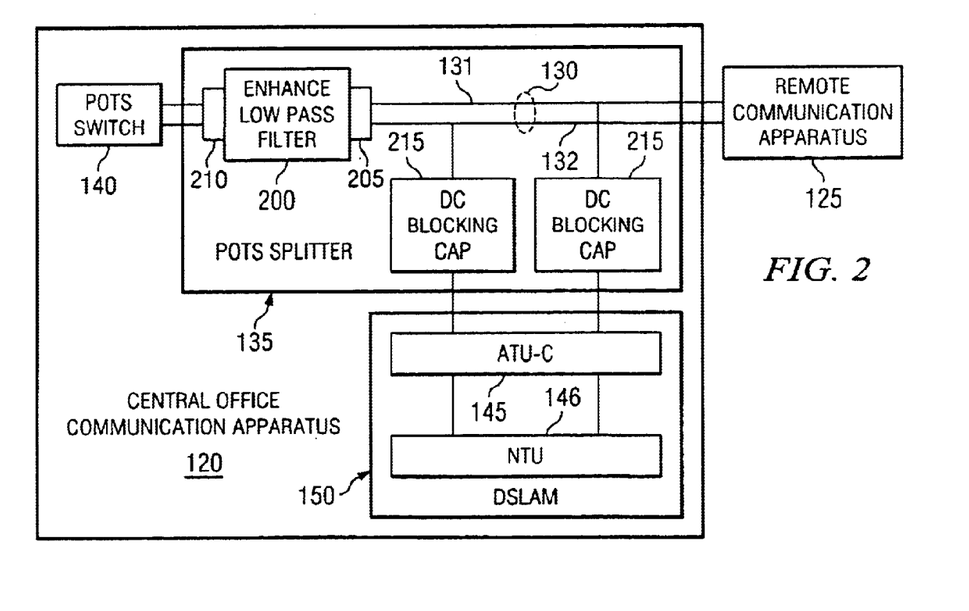
FIG. 2 is a block diagram depicting an embodiment of a POTS splitter including an enhanced low pass filter.

As depicted in FIG. 2, the CO POTS splitter 135 includes an enhanced low pass filter 200. The pair-conductor transmission line 130, including a first conductor 131 and a second conductor 132, is connected between the remote communication apparatus 125 and the enhanced low pass filter 200. The enhanced low pass 200 accomplishes filtering of the differential component of a transient voltage and filtering of the common mode component of the transient voltage. By filtering the common mode component of the transient voltage with a common mode choke as disclosed herein below, improved ADSL Bit Error Rate (BER) performance is achieved relative to conventional low pass filters.

The enhanced low pass filter 200 includes a line interface 205 and a POTS interface 210. The line interface 205 is a 2-wire port to which the paired-conductor transmission line 130 connects. The ATU-C is also connected to the line interface 205. The POTS interface (I/F) is a 2-wire port to which the POTS switch 140 connects.

The enhanced low pass filter 200 filters signaling transient energy associated with the POTS switch 140 from getting into the ADSL signal. The enhanced low pass filter 200 also filters the ADSL frequencies (above the voice band) such that the ADSL frequencies are not transmitted into the POTS switch 140. In this manner, the ADSL frequencies are not transmitted to telecommunication device on the other side of the POTS switch 140 when there is an end-to-end voice connection established by the POTS switch 140.

In at least one embodiment of the DSLAM 150, the DLSAM 150 has the POTS splitter 135, the ATU-C 145 and the NTU 146 physically mounted thereon in an integral manner. Being mounted thereon in an integral manner includes the POTS splitter 135, the ATU-C 145 and the NTU 146 being mounted in a manner that precludes the need for cables running between the splitter and the DSLAM that contains the ATU-C and NTU. In such embodiments, it is advantageous for the physical size and overall profile of the CO POTS splitter 135 and the ATU-C 145 to be minimized. As disclosed herein below in greater detail, the enhanced low pass filter 200 has a circuit design that contributes to minimizing the overall size and profile of the CO POTS splitter 135.

The CO POTS splitter 135 includes a plurality of DC blocking capacitors 215. The DC blocking capacitors are connected in series between the line interface 205 of the enhanced low pass filter 200 and the ATU-C 145. The DC blocking capacitors 215 filter DC current associated with a DC voltage from the POTS switch 140, thus preventing such DC current from being transmitted to any inadvertent low impedance or short circuit fault in the wire pair going to the ATU-C 145. In some embodiments of the CO POTS splitter 135, the DC blocking capacitors 215 are omitted since the ATU-C generally has a DC blocking capacitor in series with its line isolation transformer.

Figure 3:
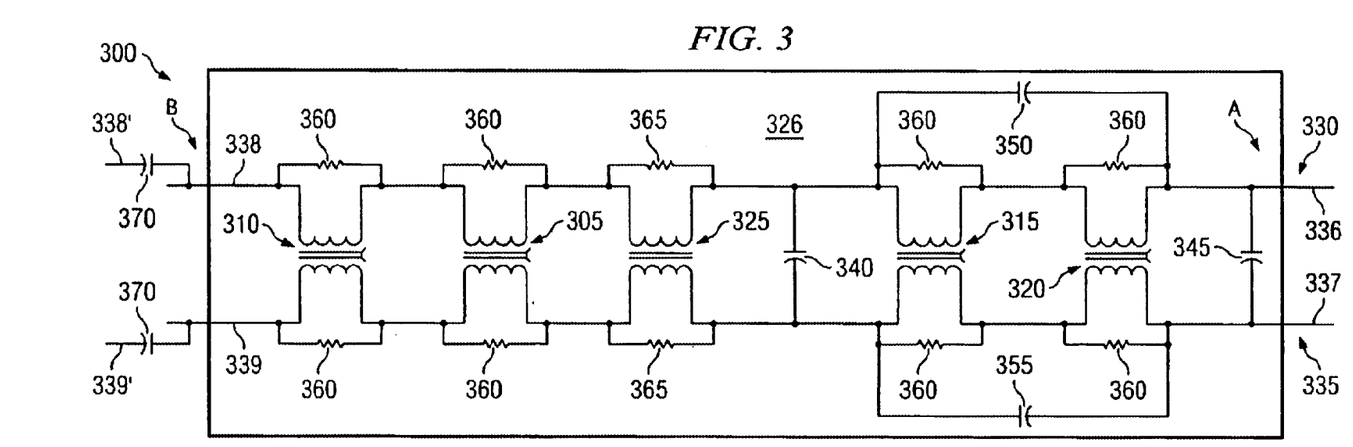
FIG. 3 is a diagrammatic view depicting an embodiment of a schematic for a first circuit design of the enhanced low pass filter depicted in FIG. 2.
Figure 4:
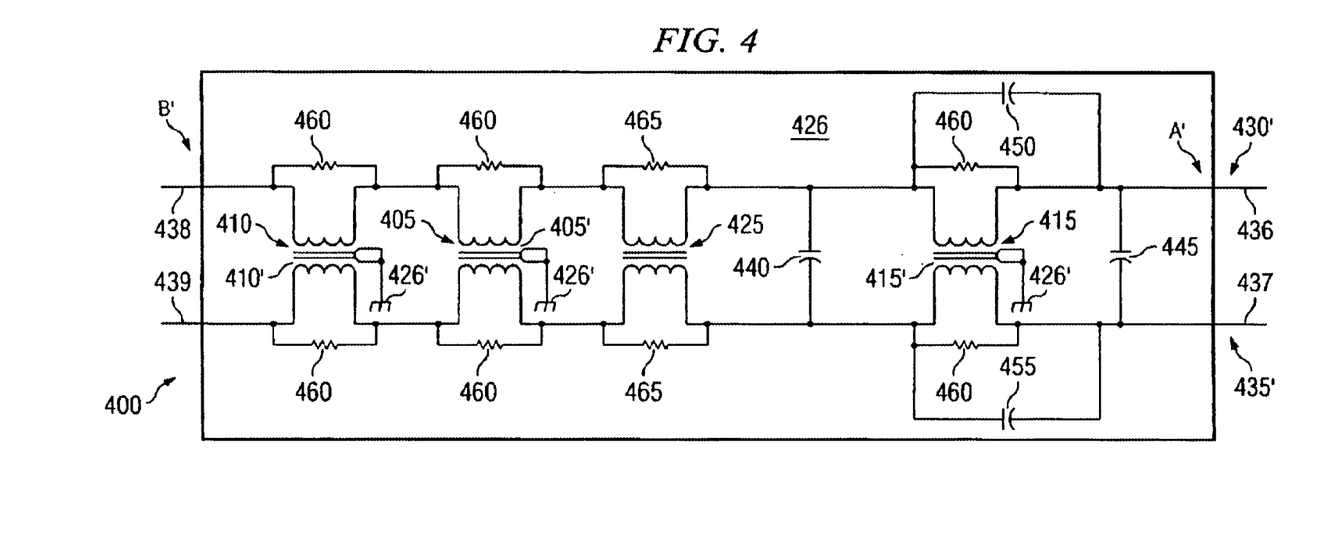
FIG. 4 is a diagrammatic view depicting an embodiment of a schematic for a second circuit design of the enhanced low pass filter depicted in FIG. 2.

FIGS. 3 and 4 depict embodiments of a first circuit design 300 of the enhanced low pass filter 200 and a second circuit design 400 of the enhanced low pass filter 200, respectively. The first and the second circuit designs 300, 400 are capable of filtering a common mode transient voltage more effectively that conventional POTS low pass filters. As mentioned above, by filtering the common mode transient voltage more effectively, the ADSL BER performance in a corresponding ADSL circuit is improved relative to ADSL circuits using conventional POTS low pass filters. Additionally, the first and the second circuit designs 300, 400 enable the enhanced low pass filter 200 to provide improved common mode filtering without adversely affecting physical size and cost relative to conventional POTS low pass filters.

Referring to FIG. 3, the first circuit design 300 includes a first dual winding inductor 305, a second dual winding inductor 310, a third dual winding inductor 315, a fourth dual winding inductor 320 and a common mode choke 325, connected as shown. The first dual winding inductor 305, the second dual winding inductor 310, the third dual winding inductor 315, the fourth dual winding inductor 320 and the common mode choke 325 are mounted on a printed circuit board (PCB) 326. The common mode choke 325 is connected between the second dual winding inductor 310 and the third dual winding inductor 315.

In at least one embodiment of the dual winding inductors 305–320, the dual winding inductors 305–320 are each wound on a dual section bobbin such that each winding occupies one of the sections. In this manner, the interwinding capacitance of each of the dual winding inductors 305–320 is reduced, thus reducing the loading down effect on the ADSL signal. Furthermore, it should be understood that the windings of the dual winding inductors 305–320 are electrically connected in a manner pertaining to magnetic polarities wherein a differential inductor is achieved for each one of the dual winding inductors 305–320.

The circuit design 300 represents one communication line of the PCB 326. In other embodiments (not shown), the PCB 326 has a plurality of communication lines thereon. It is common for a PCB containing low pass filters to provide for 4, 6, 12 or more communication lines.

A first winding of each dual winding inductor 305–320 and a first winding of the common mode choke 325 are connected in series in a TIP path 330. A second winding of each dual winding inductor 305–320 and a second winding of the common mode choke 325 are connected in series in a RING path 335. A first POTS interface lead 336 and a second POTS interface lead 337 are provided at a first end A of the TIP path 330 and RING path 335, respectively. A POTS interface of the circuit design 300 includes the first POTS interface lead 336 and the second POTS interface lead 337. A first LINE interface lead 338 and a second LINE interface lead 339 are provided at a second end B of the TIP path 330 and RING path 335, respectively. A line interface of the circuit design 300 includes the first line interface lead 338 and the second line interface lead 339.

The first circuit design 300 further includes a first capacitor 340, a second capacitor 345, a third capacitor 350, a fourth capacitor 355, a plurality of inductor damping resistors 360, and a plurality of choke damping resistors 365 and a plurality of DC blocking capacitors 370, mounted on the PCB 326 and connected as shown. Each one of the capacitors 340–355 includes a respective first lead and a respective second lead for enabling connection thereto. The dual winding inductors 305–320 and the first and second capacitors 340, 345 define a low pass filtering portion of the first circuit design 300. The first and second capacitors 340, 345 are also referred to herein as filter capacitors. The third and fourth capacitors 350, 355 are also referred to herein as attenuation pole tuning capacitors.

As discussed above in reference to FIG. 2, the DC blocking capacitors 370 are provided for preventing a DC current associated with the DC voltage of the POTS switch 140, FIG. 2, from being transmitted to any inadvertent low impedance or short circuit fault in the wire pair going to the ATU-C 145, FIG. 2. The capacitors 370 define an first ATU interface line lead 338' and a second ATU line interface lead 339'. The paired-conductor transmission line 130, FIG. 2, is connected to the first and the second line interface leads 338, 339. In applications where DC fault current is an a issue, it may be advantageous to connect the ATU-C 145, FIG. 2, to the ATU-C line interface leads 338', 339', but this is generally done at the expense of losing some upstream ADSL bandwidth. In applications where DC fault current is not an issue, the ATU-C 145 may be connected directly to the line interface leads 338, 339.

In at least one embodiment of the low pass filtering portion of the first circuit design 300, the low pass filtering portion provides $4^{th}$ order low pass filtering. The filtering portion of the first circuit design 300 provides filtering of the differential component of a transient voltage and the common mode choke provides filtering of the common mode component of the transient voltage.

The inductor damping resistors 360 improve return loss of the low pass filter 200 at the expense of sacrificing some insertion loss performance. In some applications, the damping resistors 360 improve performance with POTS signaling. The third and fourth capacitors 350, 355 provide for an elliptical low pass filter. The choke damping resistors 365 reduce detrimental effects of a series resonance of the common mode choke 325 with capacitors (not shown) that are connected from one or both of the line interface leads 338, 339 to ground in the ATU-C 145, FIG. 2.

In at least one embodiment of the common mode choke 325, the common mode choke 325 is wound in a bifilar configuration. The bifilar winding configuration resulting in a relatively high inter-winding capacitance. The common mode choke 325 is isolated from the line interface when at least one of the dual winding inductors 305, 310 is positioned between the line interface and the common mode choke 325. When the common mode choke is connected in such a manner, the degree to which the ADSL signal is loaded down by the POTS enhanced low pass filter 200 is reduced relative to conventional low pass filters that have the common choke connected directly across the line interface leads 338, 339. It should also be mentioned that it is advantageous to connect the common mode choke 325 on the side of the first capacitor 340 adjacent to the line interface leads (338, 339). In doing so, the common mode choke 325 is on the side the first capacitor 340 closest to the ADSL signal that common mode noise needs to be isolated from.

To enhance overall ADSL BER performance, the inductor or inductors not isolated from the line interface leads 338, 339 by the first capacitor 340 should not saturate under any operating condition, including transients. The first and the second dual winding inductors 305, 310 are examples of inductors that are not isolated from the line interface leads 338, 339. The first and the second dual winding inductors 305, 310 are also referred to herein as a first and a second non-isolated inductor, respectively, and the third and fourth dual winding inductors 315, 320 are also referred to herein as a first and a second isolated inductor, respectively.

The effective inductance of the non-isolated inductors presents a high bridging impedance across the ADSL signal on the line interface. The high bridging impedance prevents the enhanced low pass filter 200 from loading down the ADSL signal, thus enhancing ADSL performance. If these coils were to saturate in normal operation, they would exhibit very little inductance, thus adversely affecting the ADSL signal integrity.

As depicted in FIG. 3, the first and the second dual winding inductors 305, 310 (the first and second non-isolated inductors) are provided in series, rather than using one inductor in place of two. The first and the second dual winding inductors 305, 310 provide a required level of inductance at a DC saturation current of a sufficiently high level. Furthermore, the use of two inductors in series provides the required level of inductance in a lower profile format.

In at least one embodiment of the first and the second dual winding inductors 305, 310, the first and the second dual winding inductors 305, 310 have physical attributes and electrical attributes that are essentially the same. Physical size and DC saturation current level are examples of physical attributes and electrical attributes, respectively. The term 'essentially the same' is defined herein to include the meaning that components have the same part number or equivalent part numbers, have the same essential specifications (within typical tolerances), or both.

The use of a single inductor for providing the required level of inductance and saturation current would result in a height of the single inductor that is unacceptable in many ADSL applications. It is contemplated that in applications where physical size is not a critical issue, one non-isolated inductor may be used in place the two non-isolated inductors depicted in FIG. 3.

Referring to FIG. 4, the second circuit design 400 includes a first dual winding inductor 405, a second dual winding inductor 410, a third dual winding inductor 415, and a common mode choke 425. The first dual winding inductor 405, the second dual winding inductor 410, the third dual winding inductor 415, and the common mode choke 425 are mounted on a printed circuit board (PCB) 426. The common mode choke 425 is connected between the second dual winding inductor 410 and the third dual winding inductor 415.

In at least one embodiment of the first and the second dual winding inductors 405, 410 the first and the second dual winding inductors 405, 410 are each wound on a dual section bobbin such that each winding occupies one of the sections. In this manner, the inter-winding capacitance of the first and the second dual winding inductors 405, 410 is reduced, thus reducing the loading down effect on the ADSL signal. Furthermore, it should be understood that the windings of the first and the second dual winding inductors 405, 410 are electrically connected in a manner pertaining to magnetic polarities wherein a differential inductor is achieved. The configuration of the third dual winding inductor 415 is discussed below.

A first winding of each dual winding inductor 405–415 and a first winding of the common mode choke 425 are connected in series in a TIP path 430. A second winding of each dual winding inductor 405–415 and a second winding of the common mode choke 425 are connected in series in a RING path 435. A first POTS interface lead 436 and a second POTS interface lead 437 are provided at a first end A' of the TIP path 430 and RING path 435, respectively. A POTS interface of the circuit design 400 includes the first POTS interface lead 436 and the second POTS interface lead 437. A first line interface lead 438 and a second line interface lead 439 are provided at a second end B' of the TIP path 430 and RING path 435, respectively. A line interface of the circuit design 400 includes the first line interface lead 438 and the second line interface lead 439.

The second circuit design 400 further includes a first capacitor 440, a second capacitor 445, a third capacitor 450, a fourth capacitor 455, a plurality of inductor damping resistors 460, and a plurality of choke damping resistors 465, mounted on the PCB 426 connected as shown. Each one of the capacitors 440–455 includes a respective first lead and a respective second lead for enabling connection thereto. The dual winding inductors 405–415 and the first and second capacitors 440, 445 define a low pass filtering portion of the second circuit design 400. The first and second capacitors 440, 445 are also referred to herein as filter capacitors. The third and fourth capacitors 450, 455 are also referred to herein as attenuation pole tuning capacitors.

In at least one embodiment of the low pass filtering portion of the second circuit design 400, the low pass filtering portion provides $4^{th}$ order low pass filtering. The filtering portion of the second circuit design 400 provides filtering of the differential component of a transient voltage and the common mode choke provides filtering of the common mode component of the transient voltage.

Other than the third inductor 415 of the second circuit design 400 replacing the third and fourth dual winding inductors 315, 320 of the first circuit design 300, the second circuit design 400 is otherwise essentially structurally equivalent to the first circuit design 300. Eliminating one inductor reduces cost and provides additional space on the printed circuit board 426 for additional components, such as test relays. Even with the third inductor 415 of the second circuit design 400 replacing the third and fourth dual winding inductors 315, 320 of the first circuit design 300, it is intended for the second circuit design 400 to be essentially functionally equivalent to the first circuit design 300. For example, it is desirable for the inductance and the DC resistance of third inductor 415 of the second circuit design 400 to be essentially the same as the combined inductance and resistance of the third and the fourth dual winding inductors 315, 320 of the first circuit design 300. In this manner, the filter transmission characteristics (e.g., frequency response, insertion loss) are essentially the same for the first circuit design 300 and the second circuit design 400.

In at least one embodiment of the third dual winding inductor 415 (also referred to herein as the isolated inductor), the third dual winding inductor 415 has physical attributes approximately the same as the first and the second dual winding inductors 405, 410 and has electrical attributes that are substantially different that the first and the second dual winding inductors. Physical size and DC saturation current level are examples of physical attributes and electrical attributes, respectively. The term 'substantially different' is defined herein to include the meaning that components have different part numbers, have different nominal electrical specifications, or both.

As also disclosed above in reference to FIG. 3, inductors that are connected directly to the line interface leads 438, 439 (i.e. the inductor(s) not isolated from the line interface leads 438, 439 by at least one filter capacitor) should not saturate under any operating condition, including transients, in order to prevent loading down the ADSL signal. The worst case transient current occurs during the ring trip event. The delay from the start of the ring trip event until when the central office POTS switch removes the ringing voltage is usually long enough (typically 100 to 200 msec) for several cycles of the AC ringing voltage to elapse. The worst case transient current for saturating inductors occurs at a peak of the ringing voltage and when its phase is of the same polarity as the DC voltage that it is superimposed with (i.e., in series with) so the series AC and DC voltages add to each other. The typical peak ring trip current can be as high as 400 to 500 mA for short lines (or loops).

When the third inductor 415 saturates from ring trip currents, the low pass filter impedance bridging the line interface leads 438, 439 is not significantly affected because it is primarily determined by the first inductor 405 and the second inductor 410, jointly, and the ADSL signal is thus not loaded down. A momentary saturation of the third inductor 415 does momentarily reduce the ADSL band rejection of the filter. However, short loops inherently have more noise margin than do long loops. Accordingly, a momentary saturation of the third inductor 415 does not pose any critical issues with data errors on short loops that can have peak ring trip current in excess of the DC saturation current requirement for the third inductor 415.

For example, in at least one embodiments of the enhanced low pass filter design 400, the saturation current level of the third dual winding inductor 415 is set at about 350 mA. In the same embodiment, the saturation current level of each the first and the second dual winding inductors 405, 410 is set at about 500 mA. The use of a lower saturation current for the third dual winding inductor 415 allows the inductance of the third dual winding inductor 415 to be the same as the combined inductance of the first and the second dual winding inductors 405, 410. It is disclosed herein that it is advantageous to have the same inductance between the non-isolated inductors (the first and the second dual winding inductors 405, 410) and the isolated inductor (the third inductor 415), even when the physical size of the isolated inductor is constrained to be the same as the first and the second non-isolated inductors.

A loop length of over one half of a mile of typical telephone company outside plant cable will generally yield peak ring trip currents of less than 350 mA. Accordingly none of the isolated or non-isolated inductors saturate under any condition for loops exceeding one half mile in length. For shorter loop lengths, the upstream signal received by the central office ATU-C 145, FIGS. 1 and 2, is relatively strong so that less ADSL band attenuation is required of the POTS low pass filter 200, FIG. 2, in order to prevent the ringing cut off transient at the end of the ring trip event from causing upstream bit errors at the central office ATU-C 145. Thus, the momentary lower ADSL band attenuation caused by the isolated inductor saturating on short loops is not a problem.

If the saturation current of the third dual winding inductor 415 were set significantly lower, there still could be a problem. However, it is disclosed herein that a lower DC saturation current level for the third dual winding inductor 415 can be specified such that it is kept well above the threshold of causing a problem but yet still allows the third dual winding inductor 415 to have the same inductance as the combined inductance of the first and the second dual winding inductors 405, 410. As disclosed herein, a lower inductance level of the third dual winding inductor 415 would adversely affect the intended and required performance of the third dual winding inductor 415. Furthermore, by specifying the lower DC saturation current level for the third dual winding inductor 415, the size of the third dual winding inductor 415 can be approximately the same as each of the first and the second dual winding inductors 405, 410.

Replacing two adjacent inductors with a single inductor would require a physically larger inductor for providing essentially the same inductive performance. However, it is disclosed herein that a lower saturation current requirement is acceptable for the inductor(s) that are isolated from the line interface by at least one filter capacitor, such as the capacitor 440. Accordingly, the third inductor 415 may have a lower saturation current requirement than the saturation current requirement jointly provided by the first and the second dual winding inductors 405,410, thus allowing the third inductor 415 to have a physical size approximately the same as the first or the second dual winding inductors 405, 410.

In at least one embodiment of the inductor 415, the inductor 415 is wound in a bifilar configuration. In such an embodiment, longitudinal balance is maintained as a result of the inductor 415 being wound in a bifilar configuration. However, the bifilar configuration results in the third inductor 415 having a high inter-winding capacitance relative to the first and the second dual winding inductors 405, 410. The higher inter-winding capacitance of the third inductor 415 is acceptable because the inductor 415 is not bridged directly across the line interface leads 438, 439 and because it is essentially in parallel with and, thus, relatively negligible compared to, the first and second capacitors 440, 445.

As depicted in FIG. 4, each one of the dual winding inductors 405–415 includes a core 405'–415', respectively. Each one of the cores 405'–415' are connected to a reference voltage element 426' of the PCB 426. A ground trace and a ground plane are examples of the reference voltage element 426' of the PCB 426. In applications where communication lines are in relatively close proximity to each other, crosstalk between adjacent communication lines is reduced by connect the cores 405'–415' to the reference voltage element 426' of the PCB 426.

EXAMPLE 1

Circuit Design with 3 Low Pass Filter Inductors

An enhanced low pass filter having a circuit design substantially the same as the second circuit design 400 disclosed herein has the following nominal component specifications.

First and Second Inductors: Dual section wound, 2.5 mH per winding
(10 mH total incl. mutual coupling),
500 mA DC saturation current Third Inductor: Bifilar wound, 5 mH per winding
(20 mH total incl. mutual coupling),
350 mA DC saturation current Common Mode Choke: Bifilar wound 9 mH per winding,
100 mA
DC saturation current Inductor Damping Resistors: 5.11 kOhms first inductor
5.11 kOhms for second inductor
10 kOhms for third inductor Choke Damping Resistors: 12.1 kOhms
Filter Capacitors: 15 nF (630V) for first filter capacitor
  68 nF (630V) for second filter capacitor
Attenuation Pole Tuning Capacitor: 2.2 nF, 1.6 kV The following tests were performed on a low pass filter having a circuit design disclosed in this example and on conventional low pass filters offered by Siecor Incorporated. The most critical test conditions and worst case/best case test results are disclosed herein. The test conditions are configured to verify performance relative to the ANSI T1.413 standard and other common industry requirements.

ADSL Bit Error Rate (BER)

A system was set up for enabling the subject low pass filters to be connected in a commercially available DSLAM offered by Alcatel. The ADSL BER test comprised the following:

Test Run Duration: 3 minutes
# of Test Runs: three runs per line
Upstream Data Rate: 640 Kb/s
Downstream Data Rate: 1.536 MB/s
Cabling Configuration: 9000 ft of 26 AWG twisted pair cable.

a. ADSL BER Results—Ringing, Central Office Simulator:

A telephone was used to originate the call, and a central office simulator was used to generate the ring. At the remote end, two actual phones were connected.

| Siecor Results: | | | |
|---|---|---|---|
| Best Upstream: | SNE = 0 | Cell Loss = 12 | PRBS Error = 761 |
| Worst Upstream: | SNE = 3 | Cell Loss = 19 | PRBS Error = 1391 |
| Best Downstream: | SNE = 0 | Cell Loss = 219 | PRBS Error = 877 |
| Worst Downstream: | SNE = 5 | Cell Loss = 231 | PRBS Error = 1221 |

| Alcatel Results: | | | |
|---|---|---|---|
| Best Upstream: | SNE = 0 | Cell Loss = 0 | PRBS Error = 0 |
| Worst Upstream: | SNE = 1 | Cell Loss = 7 | PRBS Error = 690 |
| Best Downstream: | SNE = 0 | Cell Loss = 12 | PRBS Error = 92 |
| Worst Downstream: | SNE = 1 | Cell Loss = 12 | PRBS Error = 215 | b. ADSL BER Results—Ringing, 1210 Switch:

| Siecor Results: | | | |
|---|---|---|---|
| Best Upstream: | SNE = 0 | Cell Loss = 0 | PRBS Error = 0 |
| Worst Upstream: | SNE = 0 | Cell Loss = 2 | PRBS Error = 15 |
| Best Downstream: | SNE = 0 | Cell Loss = 17 | PRBS Error = 1073 |
| Worst Downstream: | SNE = 7 | Cell Loss = 52 | PRBS Error = 2190 |

| Alcatel Results: | | | |
|---|---|---|---|
| Best Upstream: | SNE = 0 | Cell Loss = 0 | PRBS Error = 0 |
| Worst Upstream: | SNE = 0 | Cell Loss = 1 | PRBS Error = 0 |
| Best Downstream: | SNE = 0 | Cell Loss = 1 | PRBS Error = 172 |
| Worst Downstream: | SNE = 1 | Cell Loss = 3 | PRBS Error = 509 | c. ADSL BER Results—Ring trip, Bulk Call Generator/CO Simulator:

The bulk call generator generates the call and terminates it in the middle of the ring once every six seconds.

| Siecor Results: | | | |
|---|---|---|---|
| Best Upstream: | SNE = 0 | Cell Loss = 7 | PRBS Error = 424 |
| Worst Upstream: | SNE = 2 | Cell Loss = 14 | PRBS Error = 623 |
| Best Downstream: | SNE = 0 | Cell Loss = 77 | PRBS Error = 442 |
| Worst Downstream: | SNE = 2 | Cell Loss = 123 | PRBS Error = 648 |

| Alcatel Results: | | | |
|---|---|---|---|
| Best Upstream: | SNE = 0 | Cell Loss = 0 | PRBS Error = 0 |
| Worst Upstream: | SNE = 0 | Cell Loss = 1 | PRBS Error = 95 |
| Best Downstream: | SNE = 0 | Cell Loss = 56 | PRBS Error = 388 |
| Worst Downstream: | SNE = 3 | Cell Loss = 60 | PRBS Error = 785 | d. ADSL BER Results—Ring trip, Bulk Call Generator and 1210 Switch:

| Siecor Results: | | | |
|---|---|---|---|
| Best Upstream: | SNE = 0 | Cell Loss = 0 | PRBS Error = 0 |
| Worst Upstream: | SNE = 0 | Cell Loss = 1 | PRBS Error = 0 |
| Best Downstream: | SNE = 0 | Cell Loss = 1 | PRBS Error = 26 |
| Worst Downstream: | SNE = 1 | Cell Loss = 5 | PRBS Error = 141 |

| Alcatel Results: | | | |
|---|---|---|---|
| Best Upstream: | SNE = 0 | Cell Loss = 0 | PRBS Error = 0 |
| Worst Upstream | SNE = 0 | Cell Loss = 1 | PRBS Error = 0 |
| Best Downstream: | SNE = 0 | Cell Loss = 0 | PRBS Error = 0 |
| Worst Downstream: | SNE = 0 | Cell Loss = 2 | PRBS Error = 4 |

Ring tests were performed with 5 REN load (2.5 uF+1.4K) at the remote end.

e. ADSL BER Results—Ringing, Central Office Simulator, 5 REN load:

| Siecor Results: | | | |
|---|---|---|---|
| Best Upstream: | SNE = 0 | Cell Loss = 20 | PRBS Error = 987 |
| Worst Upstream: | SNE = 3 | Cell Loss = 30 | PRBS Error = 1624 |
| Best Downstream: | SNE = 0 | Cell Loss = 138 | PRBS Error = 788 |
| Worst Downstream: | SNE = 7 | Cell Loss = 143 | PRBS Error = 1318 |

| Alcatel Results: | | | |
|---|---|---|---|
| Upstream: No Error | | | |
| Best Downstream: | SNE = 0 | Cell Loss = 3 | PRBS Error = 96 |
| Worst Downstream: | SNE = 1 | Cell Loss = 10 | PRBS Error = 193 |
| Worst Downstream: | SNE = 1 | Cell Loss = 10 | PRBS Error = 193 | f. ADSL BER Results—Ringing, 1210 Switch, 5 REN load:

| Siecor Results: | | | |
|---|---|---|---|
| Best/Worst results upstream: | | | |
| Best Upstream: | SNE = 0 | Cell Loss = 0 | PRBS Error = 0 |
| Worst Upstream: | SNE = 0 | Cell Loss = 1 | PRBS Error = 56 |
| Best Downstream: | SNE = 0 | Cell Loss = 3 | PRBS Error = 0 |
| Worst Downstream: | SNE = 0 | Cell Loss = 9 | PRBS Error = 88 |

Alcatel Results: No error in both up and downstream directions.

Ring tests were performed on both filters with 5 C4A REN load. Because the load was too heavy, the Central Office Simulator could not be used.

g. ADSL BER results—Ringing, 1210 Switch, 5 C4A REN load:

| Siecor Results: | | | |
|---|---|---|---|
| Best Upstream: | SNE = 0 | Cell Loss = 8 | PRBS Error = 1462 |
| Worst Upstream: | SNE = 2 | Cell Loss = 20 | PRBS Error = 1228 |
| Best Downstream: | SNE = 0 | Cell Loss = 7 | PRBS Error = 362 |
| Worst Downstream: | SNE = 2 | Cell Loss = 20 | PRBS Error = 678 |

Alcatel Results: No error in both up and downstream directions.

In general, the conventional low pass filter meets or exceeds all technical requirements called out in ANSI T1.413. However, as indicated by the results above, the low pass filter having the circuit design in the example provided superior ADSL BER performance.

EXAMPLE 2

Circuit Design with 4 Low Pass Filter Inductors

An enhanced low pass filter having a circuit design substantially the same as the first circuit design 300 disclosed herein has the following nominal component specifications.

Dual Winding Inductors: Dual section wound, 2.5 mH per winding
(10 mH total incl.mutual coupling),
500 mA DC saturation current
Common Mode Choke: Bifilar wound, 9 mH per winding, 100 mA DC saturation current
Inductor Damping Resistors: 5.11 kOhms
Choke Damping Resistors: 12.1 kOhms
Filter Capacitors: 15 nF (630V) for first filter capacitor
68 nF (630V) for second filter capacitor
Attenuation Pole Tuning Capacitors:2.2 nF, 1.6 kV The low pass filter disclosed in this example provided essentially identical ADSL BER performance as the low pass filter disclosed in Example 1.

The circuit designs disclosed herein are advantageous in that they enable improved ADSL BER performance to be achieved in the presence of POTS signaling transients without sacrificing physical size or cost of the POTS splitter. These circuit designs contribute to achieving performance that meets or exceeds the requirements specified in American National Standards Institute (ANSI) T1.413, Issue 2. This is a significant accomplishment as ANSI T1.413, Issue 2 added a fairly stringent requirement for ADSL band attenuation by the LPF with respect to ANSI T1.413 Issue 1.

The circuit designs disclosed herein provide an integrated filtering solution that addresses filtering of the differential component and the common mode component of a transient voltage. The circuit designs each include a low pass filter portion and a common mode choke for filtering the differential component and common mode component of the transient voltage, respectively. Accordingly, the circuit designs disclosed herein provide improved ADSL BER performance in the presence of POTS signaling transients relative to conventional low pass filters.

The circuit designs disclosed herein provide improved performance without sacrificing size. Relative to conventional low pass filters, a low pass filter configured according to embodiments of the circuit designs disclosed herein provide improved ADSL BER performance in the presence of POTS signaling transients in a comparable size package. This package size is advantageous as the available space for the POTS splitter in many DSLAM units, particularly high-density DSLAM units, is limited.

In the preceding detailed description, reference has been made to the accompanying drawings that form a part hereof, and in which are shown by way of illustration specific embodiments in which the invention may be practiced. These embodiments, and certain variants thereof, have been described in sufficient detail to enable those skilled in the art to practice the invention. It is to be understood that other suitable embodiments may be utilized and that logical, mechanical, chemical and electrical changes may be made without departing from the spirit or scope of the invention. For example, functional blocks shown in the figures could be further combined or divided in any manner without departing from the spirit or scope of the invention. To avoid unnecessary detail, the description omits certain information known to those skilled in the art. The preceding detailed description is, therefore, not intended to be limited to the specific forms set forth herein, but on the contrary, it is intended to cover such alternatives, modifications, and equivalents, as can be reasonably included within the spirit and scope of the appended claims.

What is claimed is:

1. An ADSL POTS splitter including an enhanced low pass filter, the enhanced low pass filter, comprising:
a first filter capacitor including a first lead and a second lead;
a first non-isolated inductor including a first winding and a second winding;
a second non-isolated inductor connected to the first non-isolated inductor and including a first winding and a second winding, the first winding of the second non-isolated inductor connected in series with the first winding of the first non-isolated inductor, the second winding of the second non-isolated inductor connected in series with the second winding of the first non-isolated inductor;
a isolated inductor connected to the first non-isolated inductor and including a first winding and a second winding, the first winding of the isolated inductor connected in series with the first winding of the first non-isolated inductor and to the first lead of the first filter capacitor, the second winding of the isolated inductor connected in series with the second winding of the first non-isolated inductor and to the second lead of the first filter capacitor, wherein the first non-isolated inductor has a respective DC saturation current and the isolated inductor has a respective DC saturation current, the DC saturation current of the first non-isolated inductor being substantially greater than the DC saturation current of the isolated inductor for achieving higher inductance in the isolated inductor, the isolated inductor being essentially the same physical size as than the first non-isolated inductor; and a common mode choke-connected between the first non-isolated inductor and the first filter capacitor, the common mode choke including a first winding and a second winding, the first winding of the common mode choke connected in series with the first winding of the first non-isolated inductor and with the first winding of the isolated inductor, the second winding of the common mode choke connected in series with the second winding of the first non-isolated inductor and with the second winding of the isolated inductor.

2. The enhanced low pass filter of claim 1 wherein the first non-isolated inductor and the second non-isolated inductor each have respective physical attributes and respective electrical attributes, said physical and electrical attributes of the first non-isolated inductor being essentially the same as said physical and electrical attributes of the second non-isolated inductor.

3. The enhanced low pass filter of claim 2 wherein said respective physical and electrical attributes of the first and the second non-isolated inductors include physical size and DC saturation current level, respectively.

4. The enhanced low pass filter of claim 2 wherein the isolated inductor has respective physical attributes and respective electrical attributes, said physical attributes of the first and the second non-isolated inductors being essentially the same as said physical attributes of the isolated inductor, said electrical attributes of the first and the second non-isolated inductors being substantially different man said electrical attributes of the isolated inductor.

5. The enhanced low pass filter of claim 4 wherein said respective physical and electrical attributes of the first non-isolated inductor, the second non-isolated inductor and the isolated inductor include physical size and DC saturation current level, respectively.

6. The enhanced low pass filter of claim 1, further comprising:
a second isolated inductor connected to the isolated inductor and including a first winding and a second winding, the first winding of the second isolated inductor connected in series with the first winding of the isolated inductor, the second winding of the second isolated inductor connected in series with the second winding of the isolated inductor.

7. An ADSL POTS splitter including an enhanced low pass filter, the enhanced low pass filter, comprising:
a first filter capacitor including a fist lead and a second lead;
a first non-isolated inductor including a first winding and a second winding;
a second non-isolated inductor connected to the first non-isolated inductor and including a first winding and a second winding, the first winding of the second non-isolated inductor connected in series with the first winding of the first non-isolated inductor, the second winding of the second non-isolated inductor connected in series with the second wining of the first non-isolated inductor,
a first isolated inductor connected to the first non-isolated inductor and including a first winding and a second winding, the first winding of the first isolated inductor connected in series with the first winding of the fist non-isolated inductor and to the first lead of the first filter capacitor, the second winding of the first isolated inductor connected in series with the second winding of the first non-isolated inductor and to the second lead of the first filter capacitor, wherein the first non-isolated inductor has a respective DC saturation current and the first isolated inductor has a respective DC saturation current, the DC saturation current of the first non-isolated inductor being substantially greater than the DC saturation current of first isolated inductor for achieving higher inductance in the first isolated inductor, the first isolated inductor being essentially the same physical size as than the first non-isolated inductor,
a second isolated inductor connected to the first isolated inductor and including a first winding and a second winding, the first winding of the second isolated inductor connected in series with the first winding of the first isolated inductor, the second winding of the second isolated inductor connected in series with the second winding of the first isolated inductor, and
a common mode choke connected between the first non-isolated inductor and the first filter capacitor, the common mode choke including a first winding and a second winding, the first winding of the common mode choke connected in series with the first winding of the first non-isolated inductor and with the first winding of the first isolated inductor, the second winding of the common mode choke connected in series with the second winding of the first non-isolated inductor and with the second winding of the first isolated inductor.

8. The enhanced low pass filter of claim 7 wherein said inductors each have respective physical attributes and respective electrical attributes, said physical and electrical attributes of each said inductor being essentially the same.

9. The enhanced low pass filter of claim 8 wherein said respective physical and electrical attributes of each said inductor include physical size and DC saturation current level, respectively.

10. The enhanced low pass filter of claim 7, further comprising:
an inductor damping resistor connected in parallel with each said winding of each said inductor.

11. The enhanced low pass filter of claim 10, further comprising:
a first attenuation pole tuning capacitor connected in parallel across the first windings of the first and the second isolated inductors; and
a second attenuation pole tuning capacitor connected in parallel across the second windings of the first and the second isolated inductors.

12. The enhanced low pass filer of claim 7 wherein:
each said inductor includes a respective dual section bobbin; and
each winding of each said inductor is wound on a respective of the respective dual section bobbin.

13. A communication apparatus comprising:
a digital subscriber line access multiplexor,
a central office ADSL transceiver unit electrically connected to the DSLAM; and
a POTS splitter including an enhanced low pass filter, the enhanced low pass filter electrically connected to the central office ADSL transceiver unit and to a remote communication apparatus, the enhanced low pass filter comprising:
a first filter capacitor including a first lead and a second lead;

a first non-isolated inductor including a first winding and a second winding;

a second non-isolated inductor connected to the first non-isolated inductor and including a first winding and a second winding, the first winding of the second non-isolated inductor connected in series with the first winding of the first non-isolated inductor, the second winding of the second non-isolated inductor connected in series with the second winding of the first non-isolated inductor, an isolated inductor connected to the first non-isolated inductor and including a first winding and a second winding, the first winding of the isolated inductor connected in series with the first winding of the first non-isolated inductor and to the first lead of the first filter capacitor, the second winding of the isolated inductor connected in series with the second winding of the first non-isolated inductor and to the second lead of the first filter capacitor, wherein the first non-isolated inductor has a respective DC saturation current and the isolated inductor has a respective DC saturation current, the DC saturation current of the first non-isolated inductor being substantially greater than the DC saturation current of the isolated inductor for achieving higher inductance in the isolated inductor, the isolated inductor being essentially the same physical size as than the first non-isolated inductor; and a common mode choke connected between the first non-isolated inductor and the first filter capacitor, the common mode choke including a first winding and a second winding, the first winding of the common mode choke connected in series with the first winding of the first no-isolated inductor and with the first winding of the isolated inductor, the second winding of the common mode choke connected in series with the second winding of the first non-isolated inductor and with the second winding of the isolated inductor.

14. The enhanced low pass filter of claim 13 wherein the common mode choke is a bifilar wound inductor.

15. The enhanced low pass filter of claim 14 wherein the first non-isolated inductor has a respective DC saturation current and the common mode choke has a respective DC saturation current, the DC saturation current of the first non-isolated inductor being substantially greater than the DC saturation current of the common mode choke.

16. The enhanced low pass filter of claim 15, further comprising:

an inductor damping resistor connected in parallel with each said winding of each said inductor; and a common mode choke damping resistor connected in parallel with each winding of the common mode choke.

17. The enhanced low pass filter of claim 16, further comprising:

an attenuation pole tuning capacitor connected in parallel with each said winding of the isolated inductor.

18. The enhanced low pass filter of claim 13, further comprising:

a second non-isolated inductor connected to the first non-isolated inductor and including a first winding and a second winding, the first winding of the second non-isolated inductor connected in series with the first winding of the first non-isolated inductor, the second winding of the second non-isolated inductor connected in series with the second winding of the first non-isolated inductor.

19. The enhanced low pass filter of claim 18 wherein the first non-isolated inductor and the second non-isolated inductor each have respective physical attributes and respective electrical attributes, said physical and electrical attributes of the first non-isolated inductor being essentially the same as said physical and electrical attributes of the second non-isolated inductor.

20. The enhanced low pass filter of claim 19 wherein said respective physical and electrical attributes of the first and the second non-isolated inductors include physical size and DC saturation current level, respectively.

21. An ADSL system, comprising:

a remote communication apparatus; and a central office communication apparatus including an enhanced low pass filter connected to the remote communication apparatus, the enhanced low pass filter comprising:

a first filter capacitor including a first lead and a second lead;

a few non-isolated inductor including a first winding and a second winding;

a second non-isolated inductor connected to the first non-isolated inductor and including a first winding and a second winding, the first winding of the second non-isolated inductor connected in series with the first winding of the first non-isolated inductor, the second winding of the second non-isolated inductor connected in series with the second winding of the first non-isolated inductor, an isolated inductor connected to the first non-isolated inductor and including a first winding and a second winding, the first winding of the isolated inductor connected in series with the first winding of the first non-isolated inductor and to the first lead of the first filter capacitor, the second winding of the isolated inductor connected in series with the second winding of the first non-isolated inductor and to the second lead of the first filter capacitor, wherein the first non-isolated inductor has a respective DC sanction current and the isolated inductor has a respective DC saturation current, the DC saturation current of the first non-isolated inductor being substantially greater than the DC saturation current of the isolated inductor for achieving higher inductance in the isolated inductor, the isolated inductor being essentially the same physical size as than the first non-isolated inductor; and a common mode choke connected between the first non-isolated inductor and the first filter capacitor, the mode choke including a first winding and a second winding, the first winding of the common mode choke connected in series with the first winding of the first non-isolated inductor and with the first winding of the isolated inductor, the second winding of the common mode choke connected in series with the second winding of the first non-isolated inductor and with the second winding of the isolated inductor.

22. The enhanced low pass filter of claim 21 wherein the common mode choke is a bifilar wound inductor.

23. The enhanced low pass filter of clam 22 wherein the first non-isolated inductor has a respective DC saturation current and the common mode choke has a respective DC saturation current, the DC saturation current of the first non-isolated inductor being substantially greater than the DC saturation current of the common mode choke.

24. The enhanced low pass filter of claim 21, further comprising:

an inductor damping resistor connected in parallel with each said winding of each said inductor; and a common mode choke damping resistor connected in parallel with each winding of the common mode choke.

25. The enhanced low pass filter of claim 24, further comprising;

an attenuation pole tuning capacitor connected in parallel with each said winding of the isolated inductor.

26. The enhanced low pass filter of claim 21 wherein the first non-isolated inductor and the second non-isolated inductor each have respective physical attributes and respective electrical attributes, said physical and electrical attributes of the first non-isolated inductor being essentially the same as said physical and electrical attributes of the second non-isolated inductor.

27. The enhanced low pass filter of claim 26 wherein said respective physical and electrical attributes of the first and the second non-isolated inductors include physical size and DC saturation current level, respectively.

* * * * *